(12) United States Patent
Perng et al.

(10) Patent No.: US 6,794,698 B1
(45) Date of Patent: Sep. 21, 2004

(54) FORMATION OF NOVEL DRAM CELL CAPACITORS BY INTEGRATION OF CAPACITORS WITH ISOLATION TRENCH SIDEWALLS

(75) Inventors: Dung-Ching Perng, San Jose, CA (US); Yauh-Ching Liu, Sunnyvale, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/549,265

(22) Filed: Apr. 14, 2000

Related U.S. Application Data

(62) Division of application No. 09/045,633, filed on Mar. 19, 1998, now Pat. No. 6,090,661.

(51) Int. Cl.[7] .................. H01L 27/108; H01L 21/8242
(52) U.S. Cl. ............. 257/296; 257/301; 257/302; 257/304; 257/905; 438/243; 438/248; 438/249; 438/258
(58) Field of Search .................. 257/296, 301–304, 257/5; 438/243, 248, 249, 258, 391–392

(56) References Cited

U.S. PATENT DOCUMENTS

| | | | | |
|---|---|---|---|---|
| 4,353,086 A | | 10/1982 | Jaccodine et al. ............. 357/51 |
| 4,811,067 A | * | 3/1989 | Fitzgerald et al. ......... 357/23.6 |
| 4,914,740 A | | 4/1990 | Kenney ....................... 357/23.6 |
| 4,916,511 A | | 4/1990 | Douglas ...................... 357/23.6 |
| 4,922,313 A | * | 5/1990 | Tsuchiya .................... 357/23.6 |
| 4,999,689 A | * | 3/1991 | Iguchi et al. ............... 357/23.6 |
| 5,026,658 A | | 6/1991 | Fuse et al. ..................... 437/52 |
| 5,041,887 A | | 8/1991 | Kumagai et al. .......... 357/23.6 |
| 5,049,959 A | | 9/1991 | Satoh ......................... 357/23.6 |
| 5,075,248 A | * | 12/1991 | Yoon et al. .................... 437/52 |
| 5,112,771 A | | 5/1992 | Ishii et al. ................... 438/389 |
| 5,200,354 A | | 4/1993 | Om et al. .................... 438/243 |
| 5,273,928 A | | 12/1993 | Tani ............................. 437/60 |
| 5,315,543 A | | 5/1994 | Matsuo et al. .............. 365/149 |
| 5,395,786 A | | 3/1995 | Hsu et al. .................... 438/248 |
| 5,442,211 A | | 8/1995 | Kita ............................ 257/301 |
| 5,488,242 A | * | 1/1996 | Sunouchi et al. ........... 257/301 |
| 5,585,285 A | | 12/1996 | Tang ............................ 437/21 |
| 5,618,745 A | | 4/1997 | Kita ............................ 438/164 |
| 5,618,751 A | | 4/1997 | Golden et al. .............. 438/392 |
| 5,701,022 A | | 12/1997 | Kellner et al. .............. 257/300 |
| 5,844,266 A | | 12/1998 | Stengl et al. ................ 257/301 |
| 5,990,511 A | | 11/1999 | Leas |
| 5,998,822 A | * | 12/1999 | Wada .......................... 257/301 |
| 6,090,661 A | | 7/2000 | Perng et al. |

FOREIGN PATENT DOCUMENTS

| | | | |
|---|---|---|---|
| EP | 177-066 A | * | 9/1986 |
| JP | 64-25457 A | * | 1/1989 |
| JP | 64025457 A | * | 1/1989 |

OTHER PUBLICATIONS

H. Hada, et al., "Using Anisotropical Selective Epitasial Silicon for Giga–Bit DRAMs," 1995, Kanagawa, Japan, *IEEE*.

* cited by examiner

*Primary Examiner*—Donghee Kang
(74) *Attorney, Agent, or Firm*—Beyer Weaver & Thomas, LLP

(57) ABSTRACT

A DRAM cell capacitor is described. Capacitor formation and cell isolation methods are integrated by using existing isolation trench sidewalls to form DRAM capacitors. A doped silicon substrate adjacent to the vertical sidewalls of the isolation trench provides one DRAM cell capacitor plate. The DRAM capacitor also contains a dielectric material that partially covers the interior vertical sidewalls of the isolation trench. A conductive layer covering the dielectric material on the vertical sidewalls of the isolation trench forms the second capacitor plate and completes the DRAM capacitor.

16 Claims, 11 Drawing Sheets

FORMATION OF NOVEL DRAM CELL CAPACITORS BY INTEGRATION OF CAPACITORS WITH ISOLATION TRENCH SIDEWALLS

This is a Divisional application of prior application Ser. No. 09/045,633 filed on Mar. 19, 1998, Now U.S. Pat. No. 6,090,661, the disclosure of which is incorporated herein by reference.

BACKGROUND OF THE INVENTION

1. Field of the Invention

The present invention relates to semiconductor devices and methods for their construction. More particularly, the present invention relates to capacitor design and cell isolation methods used to reduce the surface area occupied by a DRAM cell. More specifically, the present invention merges capacitor design and cell isolation methods by using existing isolation trench sidewalls to form a DRAM capacitor thus increase DRAM cell density by at least about two fold over currently fabricated DRAM cells.

2. Background Art

Various DRAM capacitor designs have been employed to reduce the surface area occupied by a single DRAM cell. Early DRAM designs employed flat horizontal capacitor plates. Later designs, intended to conserve chip surface area, employed trenches or fin structures to form narrow dimension capacitors with some vertical contribution to the capacitor plate surface area.

In addition to the shape and size of the capacitor plates, the type of cell isolation contributes to the overall DRAM cell size. Traditionally, field oxide produced by the LOCal Oxidation of Silicon process (LOCOS) was used as cell isolation. Unfortunately, a field oxide must cover a fairly wide area in order to effectively isolate adjacent cells. Further, it is difficult to control the growth of field oxide. Therefore, field oxide often occupies a significant amount of the chip surface area.

More recently, trench isolation has been employed. This involves etching a narrow isolation trench around the active areas (cells) on the chip. The isolation trenches are then filled with oxide or other dielectric to effectively isolate adjacent active areas from one another. While trench isolation requires more process steps than field oxide isolation, trench isolation can be made much narrower than field oxide isolation. Therefore, DRAMs employing trench isolation can be packed more densely than DRAMs employing field oxide (LOCOS) isolation.

In the continuing quest for higher density DRAMs, improved structures employing trench isolations are still needed.

SUMMARY OF THE INVENTION

The present invention addresses this need by providing a DRAM cell where existing isolation trench sidewalls are used to form a DRAM capacitor. Integration of capacitor formation with DRAM cell isolation increases DRAM cell density by at least about two fold over currently fabricated DRAM cells.

In one aspect, the instant invention provides a DRAM cell comprised of a pass (or access) transistor electrically coupled with the capacitor and an isolation trench on a semiconductor substrate. The isolation trench electrically isolates the DRAM cell from one or more adjacent DRAM cells. The capacitor is comprised of a first capacitor plate, a dielectric layer and a second capacitor plate. The first capacitor plate is defined by the semiconductor substrate at the wall of the isolation trench. The second capacitor plate is defined by a conductive layer inside the isolation trench. The first and second capacitor plates are separated by the dielectric layer.

The pass transistor is a MOS device that may have a drain electrically connected to the second capacitor plate and electrically isolated from the first capacitor plate. In one embodiment, the isolation trench has a depth of at least about 0.3 micrometers. In another embodiment, the isolation trench has a width of at most about 0.5 micrometers. Preferably, the isolation trench is at least partially filled with a dielectric material.

In a specific embodiment, the first capacitor plate has a substantially greater dopant concentration than immediately adjacent semiconductor substrate. The second capacitor plate occupies a portion of the isolation trench proximate to the pass transistor. The conductive layer that comprises the second capacitor plate is preferably doped polysilicon. It may be between about 200 angstroms and about 2000 angstroms thick.

The dielectric layer may be made from any suitable material that can be formed in the necessary size and shape. Suitable dielectric materials include at least one of $SiO_2$, $Si_3N_x$, silicon oxynitride, ONO (silicon oxide/silicon nitride/silicon oxide layered material), tantalum pentaoxide ($Ta_2O_5$), barium strontium titanate ((Ba, Sr) Ti $O_3$ ("BST")), and piezoelectric lead zirconate titanate ("PZT"). Preferably, the dielectric layer comprises a material with a high dielectric constant (e.g., at least about 10) such as BST, PZT, or $Ta_2O_5$. In one specific embodiment, the dielectric layer is $Ta_2O_5$ and is between about 20 and about 200 angstroms thick depending on the capacitor plate area.

In another aspect, the invention provides a method for forming a capacitor in an isolation trench of an integrated circuit. The process is characterized by forming an isolation trench in a semiconductor substrate and then forming a capacitor in the isolation trench. Later, the trench is filled with isolation dielectric.

In one embodiment, the isolation trench includes both a capacitor dielectric and an isolation trench dielectric which occupy different areas of the isolation trench. This does not preclude embodiments where the isolation dielectric and the capacitor dielectric are made from the same material; although one will generally want an isolation dielectric with a relatively low dielectric constant and a capacitor dielectric with a relatively high dielectric. In one embodiment, the isolation trench is etched to a depth of at least about 0.5 micrometers. In another embodiment, the isolation trench is formed to a width of at most about 0.25 micrometers.

The capacitor is formed by a process that may be characterized as having the following sequence: (a) forming the first capacitor plate in the semiconductor substrate immediately adjacent the sidewalls of the isolation trench; (b) forming a capacitor dielectric layer on part of the sidewalls of the isolation trench; and (c) forming a second capacitor plate on a part of the capacitor dielectric.

The first capacitor plate may be formed by a process where a dopant source material is provided on a portion of the isolation trench sidewalls. This material furnishes a source of dopant atoms which are driven into the adjacent semiconductor substrate. The dopant source material may be conformally deposited on the trench sidewalls and then selectively removed from the top portion of the isolation trench. The location of the remaining source material defines the location of the first capacitor plate. The dopant source material may be removed from the top of the vertical sidewalls of the isolation trench by a process that may be characterized as having the following sequence: (a) depositing photoresist in the isolation trench; (b) exposing the photoresist to a specific depth in the isolation trench; (c) developing the photoresist (to remove the exposed upper part of the photoresist); and (d) removing the dopant source material from the top portion of the vertical sidewalls of the isolation trench.

The process may subsequently strip or otherwise remove the photoresist from the isolation trench. Then an oxide may be deposited to cap the dopant source material and prevent diffusion at the top portion of the trench. Ultimately, the device is annealed to drive dopant from the source material into the adjacent substrate, thereby forming the first capacitor plate. Thereafter, the source material is removed from the treanch.

In one embodiment, the dopant source material is a boron doped glass. In a specific embodiment, the boron doped glass is deposited to a thickness of between about 100 angstroms and about 2,000 angstroms. In another specific embodiment, the boron doped glass has a dopant concentration of between about $1 \times 10^{18}$ and about $1 \times 10^{22}$ atoms/centimeter$^3$.

The capacitor dielectric may be provided by a process similar to that employed to form and shape the dopant source material. Specifically, the capacitor dielectric may be conformally deposited and then removed from the top of the vertical sidewalls of the isolation trench. The capacitor dielectric may be removed from the top of the vertical sidewalls of the isolation trench by a process that may be characterized as having the following sequence: (a) depositing photoresist over the isolation trench; (b) exposing the photoresist to a specific depth in the isolation trench; (c) developing the photoresist; (d) removing the capacitor dielectric from the top portion of the vertical sidewalls of the isolation trench. Thereafter, the process may strip or otherwise remove the photoresist from the isolation trench.

The second capacitor plate may be provided by a process comprising (a) conformally depositing a layer of conductor such as polysilicon or titanium nitride (or platinum in the case of BST dielectric) in a portion of the isolation trench followed by (b) an anisotropic etch that preferentially removes polysilicon from the bottom surface of the isolation trench while retaining polysilicon at the vertical sidewall of the isolation trench to form the second capacitor plate.

These and other features and advantages of the present invention will be further described in the following detailed description of the invention with reference to the associated drawings.

BRIEF DESCRIPTION OF THE DRAWINGS

The invention will be further illustrated by reference to the following drawings in which.

DETAILED DESCRIPTION OF THE PREFERRED EMBODIMENTS

Figure 1A:
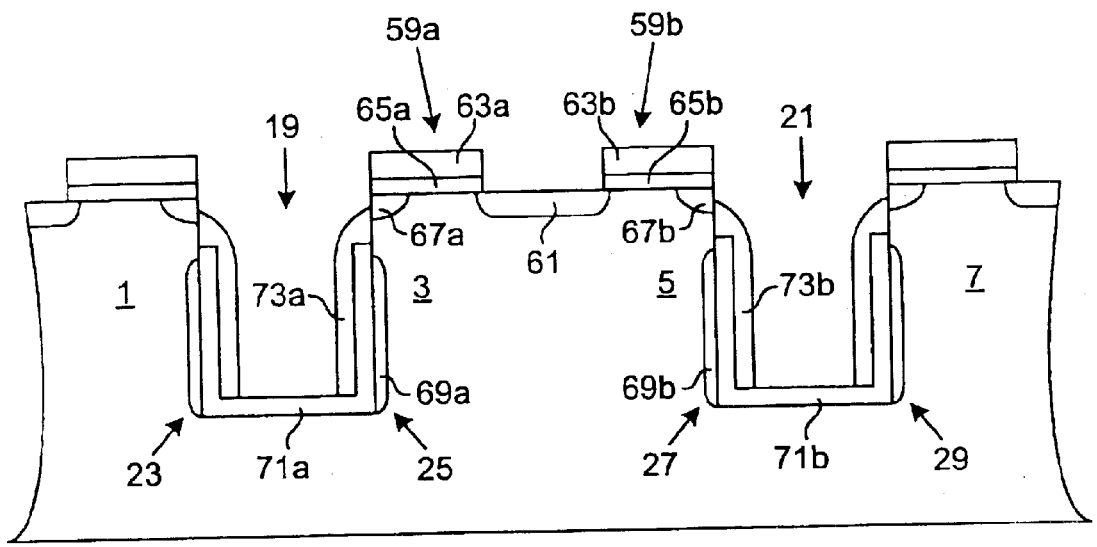
FIG. 1A is a cross sectional view of a multi-cell DRAM structure that illustrates a two cell trench isolation structure flanked by two other two cell trench isolation structures (partially shown).
Figure 1B:
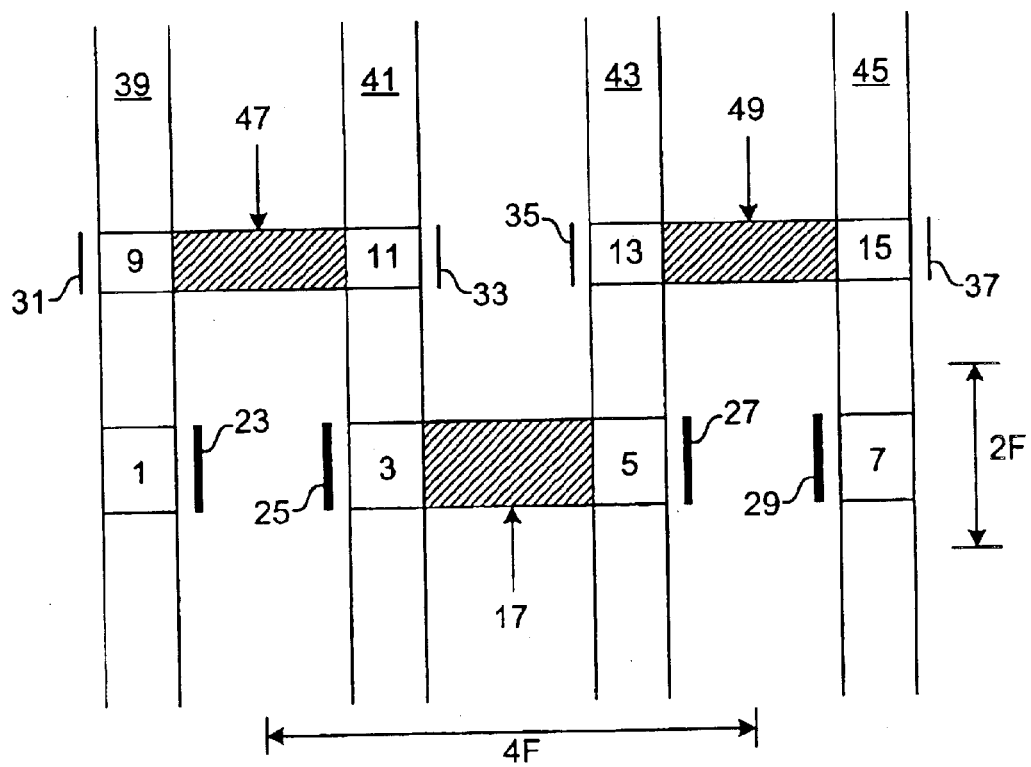
FIG. 1B is a top view of the multi-cell DRAM structure illustrated in FIG. 1A which shows a word line and bit line contact layout.

A preferred embodiment of the present invention is now described with reference to FIGS. 1A, 1B, and 2–16 where like reference numbers indicate identical or functionally similar elements. FIGS. 1A and 1B illustrate cross sectional and top views of a multi-cell layout in the DRAM structure of the instant invention. FIGS. 2–7 illustrate formation of one capacitor plate in the semiconductor substrate that is parallel to and adjacent the vertical sidewalls of an isolation trench. FIGS. 8–15 depict completion of the capacitor by dielectric deposition and formation of the second capacitor plate on the vertical sidewalls of the isolation trench. FIG. 16 illustrates the isolation trench sidewall capacitors after conventional (or slightly modified) transistor process flow to form a pass (or access) transistor.

While the invention will be described in conjunction with a preferred embodiment, it will be understood that it is not intended to limit the invention to one preferred embodiment. To the contrary, it is intended to cover alternatives, modifications, and equivalents as may be included within the spirit and scope of the invention as defined by the appended claims.

FIG. 1A is a cross sectional view of a multi-cell DRAM structure illustrating one complete "two cell trench isolation structure" flanked by two other two cell half trench isolation structures (each partially shown). Note that the two cell trench isolation structures in this layout are delineated by surrounding trench isolation regions. Four different DRAM cells 1, 3, 5, 7 are associated with four different trench sidewall capacitors 23, 25, 27 and 29, respectively. Capacitors 23 and 25 are located in the sidewalls of a trench 19 while capacitors 27 and 29 are located in the sidewalls of a trench 21. DRAM cells 3 and 5, associated with trench sidewall capacitors 25 and 27 respectively, comprise a complete two cell trench isolation structure. Both DRAM cells 1 and 7, associated with trench sidewall capacitors 23 and 29 respectively, individually comprise one half of a two cell trench isolation structure. For simplicity in the illustration, the second cells of those structures are not shown.

Cell 3 has an access transistor 59a including a source region 61, a gate electrode 63a, a gate dielectric 65a (e.g. silicon oxide), and a drain 67a. Source 61 and drain 67a will be doped regions of common conductivity type (e.g., both are n type) in a semiconductor substrate. Cell 5 similarly includes an access transistor 59b including source region 61, a gate electrode 63b, a gate dielectric 65b, and a drain 67b. Note that transistors 59a and 59b share source 61. A bit line contact (not shown) connects to source 61. Cells 1 and 7 have similarly configured access transistors not specifically referenced in this discussion.

Capacitor 25 includes a first plate 69a, a capacitor dielectric layer 71a, and a second plate 73a. First plate 69a is a doped region in the semiconductor substrate adjacent a portion of a sidewall of trench 19. Its conductivity type is opposite that of the source and drain regions (e.g., it is a p+ region when source 61 and drain 67a are n type). Thus, it is electrically isolated from transistor 59a Dielectric layer 71a covers a sidewall of trench 19 adjacent to first plate 69a It may (but need not) extend continuously across the bottom of trench 19 and up another other sidewall of the trench to serve as the dielectric layer of capacitor 23. The capacitor dielectric layer may be made from any compatible material such as silicon oxide, silicon nitride, silicon oxynitride, silicon oxide/silicon nitride/silicon oxide layered material, tantalum oxide, BST, and PZT. Preferably, the dielectric layer is formed of a material having a relatively high dielectric constant of at least about 10. Second capacitor plate 73a contacts dielectric 71a but is conductively isolated from first plate 69a and capacitor 23. It is, however, conductively coupled to drain 67a. Preferably plate 73a is formed from a doped polysilicon layer.

Capacitor 27 is similarly configured to include a first capacitor plate 69b (a doped region of the substrate abutting a sidewall of trench 21), a dielectric layer 71b, and a second capacitor plate 73b. Capacitors 23 and 29 are similarly configured but not specifically detailed by reference numbers in order to simplify the illustration.

FIG. 1B is a top view of the multi-cell DRAM structure illustrated in FIG. 1A which shows word line and bit line contact layout. FIG. 1B shows multiple rows and columns of DRAM cells and thus illustrates more DRAM cells than depicted in FIG. 1A.

Wordlines 39, 41, 43 and 45 contact gates of DRAM cells 1, 3, 5, 7, 9, 11, 13, and 15 that include isolation trench sidewall capacitors 23, 25, 27, 29, 31, 33, 35 and 37 respectively. Specifically, wordline 39 connects DRAM cells 1 and 9, wordline 41 connects DRAM cells 3 and 11, wordline 43 connects DRAM cells 5 and 13, and wordline 45 connects DRAM cells 7 and 15. DRAM cells 1, 3, 5 and 7 and isolation trench sidewall capacitors 23, 25, 27 and 29 correspond to the DRAM cells and isolation trench sidewall capacitors depicted in FIG. 1A.

Bitline contacts are provided to a region 17 located between DRAM cells 3 and 5 (and corresponding to source region 61), a region 47 located between DRAM cells 9 and 11 and a region 49 located between DRAM cells 13 and 15. Regions 17, 47 and 49 each comprise a shared active area or source between DRAM cells 3 and 5, DRAM cells 9 and 11 and DRAM cells 13 and 15 respectively. A bitline (not shown) overlies cells 1, 3, 5, and 7, and electrically connects to region 17. Another bitline (also not shown) overlies cells 9, 11, 13, and 15 and electrically connects to regions 47 and 49.

DRAM cells 3 and 5, 9 and 11, and 13 and 15, associated with trench sidewall capacitors 25 and 27, 31 and 33, 35 and 37 respectively, form two cell trench isolation structures. Both DRAM cells 1 and 7, associated with trench sidewall capacitors 23 and 29 respectively, individually comprise one half of a two cell trench isolation structure.

The parameter "F" is the minimum feature size attainable by a process employed to fabricate a memory device containing the DRAM cells of this invention (e.g., F defines both the minimum isolation trench widths and the minimum wordline widths attainable with the process under consideration). As depicted in FIG. 1B, the area required by adjacent DRAM cells 3 and 5 located on wordlines 41 and 43 is $8F^2$. This can be understood as follows. Wordlines 41 and 43 each require 1F, bitline contact 17 requires 1F (in the horizontally depicted dimension), and the portions of trenches 19 and 21 attributable to cells 3 and 5 is ½F each. Thus, cells 3 and 5 require, in total, 4F linear space in the horizontally depicted dimension. In the vertically depicted dimension, cells 3 and 5 occupy the width of bitline contact region 17 (1F) and their respective portions (½F) of adjacent trench isolation regions located above and below (in the figure). Thus, cells 3 and 5 require, in total, 2F linear space in the vertically depicted dimension. As shown, the size of a two cell unit made by the method of the instant invention is $8F^2$. And a single cell requires $4F^2$, which is a substantial improvement over the $8-9F^2$ available through conventional DRAM technology. Thus, the instant invention provides trench isolation DRAM cells which require significantly less wafer surface area than DRAM cells made using existing technology.

The above DRAM devices may be formed by any suitable process. In general, the process will include steps of forming isolation trenches, forming capacitors in those trenches, and forming pass transistors for accessing the isolation trench capacitors. One process for fabricating a trench isolation type DRAM device of this invention will now be described, referring initially to FIG. 2. The process begins with a semiconductor substrate 30 (e.g., a single crystal silicon wafer) patterned via a hard mask 2 to define an array of two cell isolation structures and surrounding trench lattice work as depicted in FIGS. 1A and 1B. In other words, the array layout includes a repeating array of rectangular mesa-like structures (each 1F by 3F, vertical to horizontal) containing the pass transistors for two adjacent DRAM cells sharing a common source (e.g., cells 3 and 5 together with bitline contact region 17, cells 9 and 11 together with bitline contact region 47, etc.) delineated by a continuous trench latticework.

Figure 2:
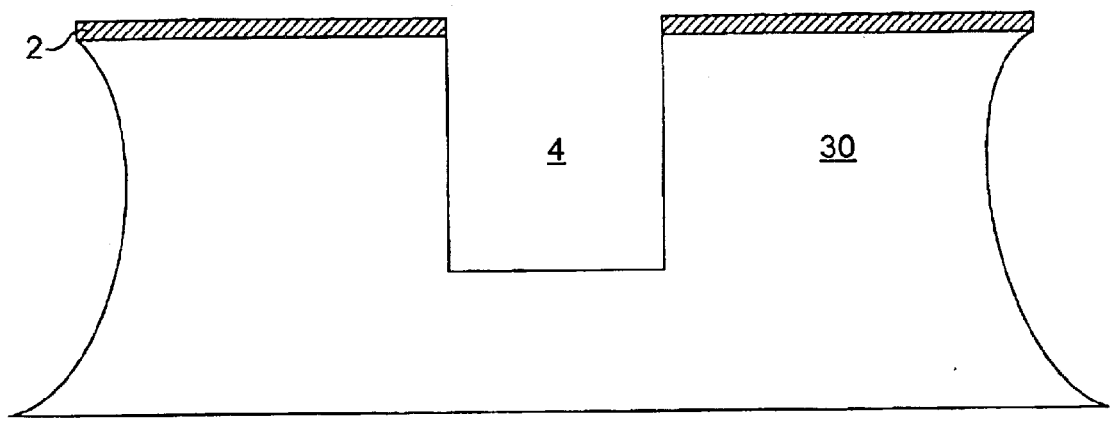
FIG. 2 is a cross sectional view of the isolation trench sidewalls used to form two DRAM capacitors after trench isolation etch.

The structure depicted in FIG. 2 is a cross sectional view through substrate 30 to illustrate the isolation trench sidewalls used to form two DRAM capacitors after trench isolation etch. FIGS. 2–12 represent a trench cross section viewed through either a horizontal or vertical cut in the structure viewed from above in FIG. 1B.

Hard mask 2 is deposited on semiconductor substrate 30 which is preferably a uniformly lightly p doped single crystal silicon wafer. Alternatively, semiconductor substrate 30 can be a lightly n doped single crystal silicon wafer and/or include regions of nonuniform doping and may even include an epitaxial layer. Hard mask layer 2 is left on the wafer surface to protect semiconductor substrate 30 from degradation during subsequent process steps used to form isolation trench sidewall capacitors and complete device fabrication. Preferably, mask layer 2 will be silicon nitride. Alternatively, mask layer 2 can be silicon oxide, alternating layers of silicon oxide and nitride or other suitable materials.

Trench 4 is formed using conventional process steps such as dry etching. The mask layer 2 is first patterned to define an exposed region above incipient isolation trench 4. In general, a patterned mask will include regions containing an etchant resistant material that protects the semiconductor substrate during the subsequent etch and exposed regions at locations above the incipient isolation trenches. The patterning process may be performed by photolithography or other well known methods. Preferably, a plasma etch employing $NF_3/O_2$ chemistry in a TCP 9400 reactor, available from Lam Research Corporation of Fremont, Calif., is used to form isolation trench 4. Alternatively, reactors, available from Applied Materials Corporation of Santa Clara, Calif. or other suitable semiconductor reactor sources, that use conventional silicon etch conditions can be used to etch semiconductor substrate 30 to form isolation trench 4.

Preferably, isolation trench 4 has a depth of at least about 0.3 micrometers (more preferably between about 0.1 μm and about 10 micrometers and a width of at most about 0.5 micrometers (more preferably between about 0.1 μm and about 2 micrometers). In a specific embodiment employing a tantalum pentaoxide dielectric layer, the dielectric layer has a height of about 0.66 μm and a width of about 0.25 μm. Obviously, these dimensions can vary depending upon the process technology employed and trench widths can be expected to decrease in future generations.

Figure 3:
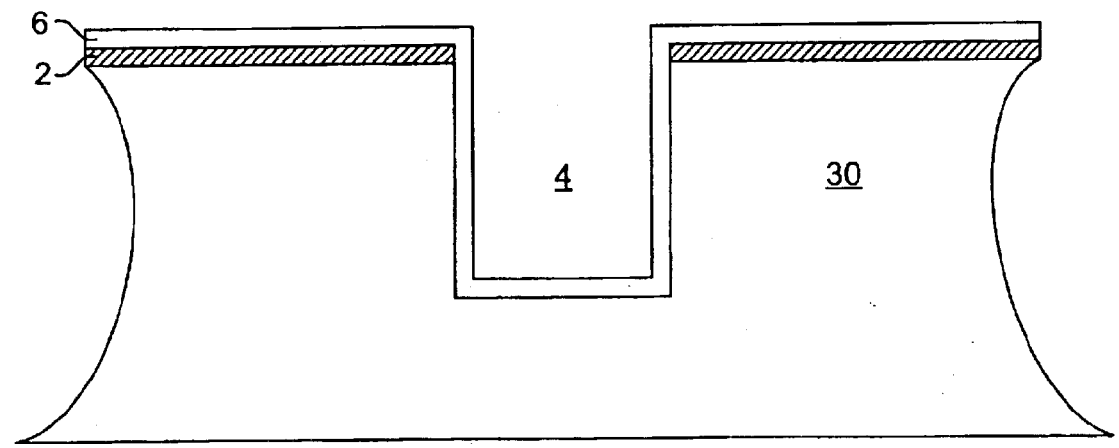
FIG. 3 is a cross sectional view of the isolation trench sidewalls used to form two DRAM capacitors after deposition of a doped layer.

FIG. 3 is a cross sectional view of the partially fabricated structure illustrating the isolation trench sidewalls used to form two DRAM capacitors after deposition of a dopant source layer 6. Dopant source layer 6 may contain any suitable n or p type dopant such as, for example, boron, phosphorus and arsenic. Preferably, glass ($SiO_2$), heavily doped with up to about $1 \times 10^{22}$ atoms/cm$^3$ boron, is conformally deposited to form layer 6. Alternatively, arsenic or phosphorus doped oxide or any other suitable doped material can be used to form layer 6. Typically, the thickness of dopant source layer 6 depends on the dopant concentration in the deposited material, the mobility of dopant atoms in the layer, etc. Thus, greater amounts of lightly doped materials must be deposited than when heavily doped materials are used to form layer 6. In one specific embodiment, layer 6 is a glass having an boron concentration of between about $1 \times 10^{18}$ and $1 \times 10^{22}$ atoms/cm$^3$ and a thickness of between about 100 Å and about 2000 Å. Most preferably, layer 6 is between about 150 Å and about 250 Å thick with concentration of about $3 \times 10^{19}$ atoms/cm$^3$.

Figure 4:
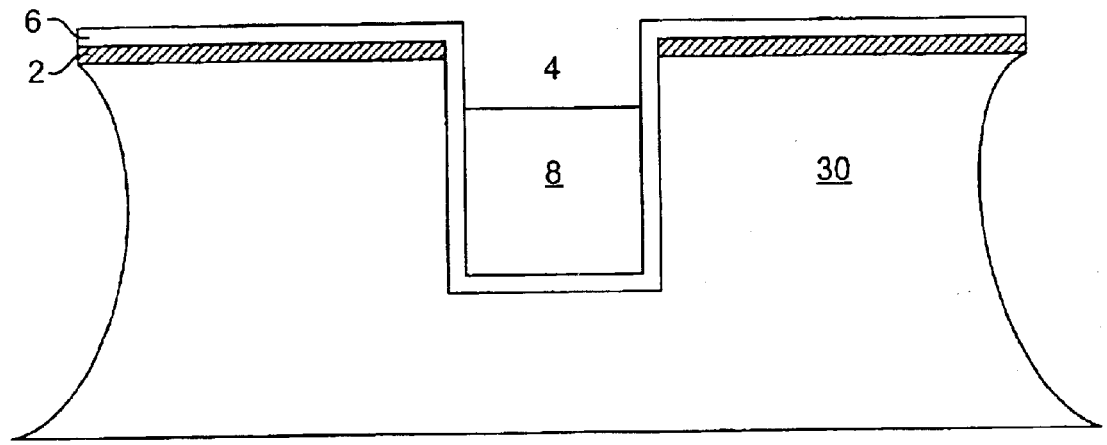
FIG. 4 is a cross sectional view of the isolation trench sidewalls used to form two DRAM capacitors after photoresist deposition, blanket photoresist exposure and development.

FIG. 4 is a cross sectional view of the partially fabricated structure illustrating the isolation trench sidewalls after photoresist deposition, blanket photoresist exposure and development. Photoresist is deposited on layer 6 and fills isolation trench 4 using conventional conditions. Careful control of the depth of focus and dose of blanket photoresist exposure determines the amount of resist removed during the process. The height of photoresist remaining in the treanch is a function of the composition and initial thickness of photoresist, the depth of focus and the exposure eneregy. These last two parameters are controlled by the optics of the system After development photoresist 8 partially fills isolation trench 4 as shown.

Alternatively, a selective plasma etchback of deposited photoresist can provide recessed photoresist 8. Here, the photoresist material, etch conditions, and length of time the photoresist is exposed to the etch conditions control the amount of photoresist removed. In one embodiment, the etch back step is a dry etch emptying an oxygen chemistry.

Significantly, photoresist outside of isolation trench 4 has been removed and the height of photoresist layer 8 in isolation trench 4 is below the level of the hard mask 2. Thus, photoresist layer 8 protects immediately adjacent doped layer 6 on the sidewalls of isolation trench 4 during the next process step, thus allowing for selective removal of any doped layer 6 at the top of sidewalls of isolation trench 4 and over hard mask 2. After photoresist development, in one specific example, the photoresist fills up about the bottom ⅔ of the trench.

Figure 5:
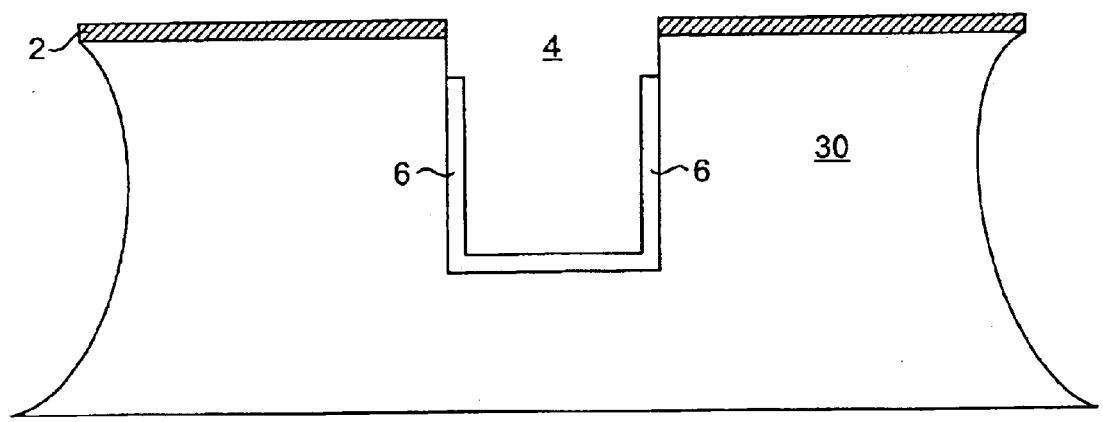
FIG. 5 is a cross sectional view of the isolation trench sidewalls used to form two DRAM capacitors after etching of the doped layer and photoresist removal.

FIG. 5 is a cross sectional view of the partially fabricated DRAM device after etching of the doped layer and photoresist removal. Wet etch using dilute HF (e.g. about a 100 to 1 dilution of aqueous HF), for example, removes any doped layer 6 that is not covered by photoresist 8 in isolation trench 4 while leaving hard mask 2 and silicon substrate 30 unaffected. Then, photoresist 8 is stripped or otherwise removed, using well known methods, to provide doped layer 6 selectively located on the sidewalls of isolation trench 4. The height of doped layer 6 on the vertical sidewalls of isolation trench 4 is substantially similar to the height of photoresist layer 8 in FIG. 4. Thus, controlling the vertical height of photoresist in isolation trench 4 through blanket photoexposure determines the eventual vertical height of doped layer 6 in isolation trench 4.

Figure 6:
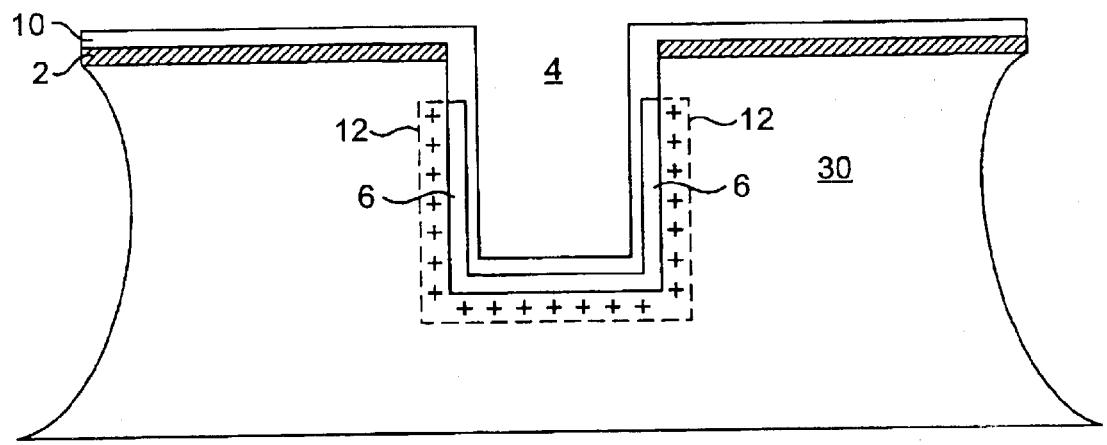
FIG. 6 is a cross sectional view of the isolation trench sidewalls used to form two DRAM capacitors after oxide deposition and annealing.

FIG. 6 is a cross sectional view through the isolation trench sidewalls used to form two DRAM capacitors after oxide deposition and annealing. An oxide layer 10 is now conformally deposited in trench 4 and over hard mask 2 using conventional conformal deposition methods. Preferably, oxide layer 10 is between about 200 and about 1000 angstroms thick. Most preferably, oxide layer 10 is between about 400 and about 600 angstroms thick.

The function of oxide layer 10 is to prevent any outdiffusion from the doped layer 6 during subsequent annealing. Oxide layer 10 effectively constrains dopant in layer 6 to selectively diffuse into silicon substrate 30, thus protecting the partially fabricated device from dopant contamination during subsequent dopant drive in and annealing.

Dopant drive in is accomplished using a rapid thermal process at about 1000° C. for between about 30 seconds and about 5 minutes. Then, annealing at between about 900° C. and about 1100° C. (more preferably at about 1050° C.) for between about 10 minutes to about 40 minutes provides region 12 which functions as a capacitor plate of a trench isolation sidewall capacitor. Typically, the annealing time depends on the thickness and the dopant concentration of layer 6. Substrate plate 12 is comprised of heavily doped semiconductor substrate that contains substantially greater dopant concentration than immediately adjacent semiconductor substrate 30. At a minimum, the plate dopant concentration should be greater the substrate dopant concentration. In one preferred embodiment, the surface dopant concentration in plate 12 is at least about $5 \times 10^{17}$ aresenic atoms/cm$^3$. Preferably, the diffusion depth of plate region 12 is about 0.05 to 0.3 micrometers; more preferably about 0.1 to 0.15 micrometers. Importantly, substrate plate 12 is located next to dopant source layer 6. Thus, the height of dopant source layer 6 controls the height of capacitor plate region 12 in semiconductor substrate 30.

Figure 7:
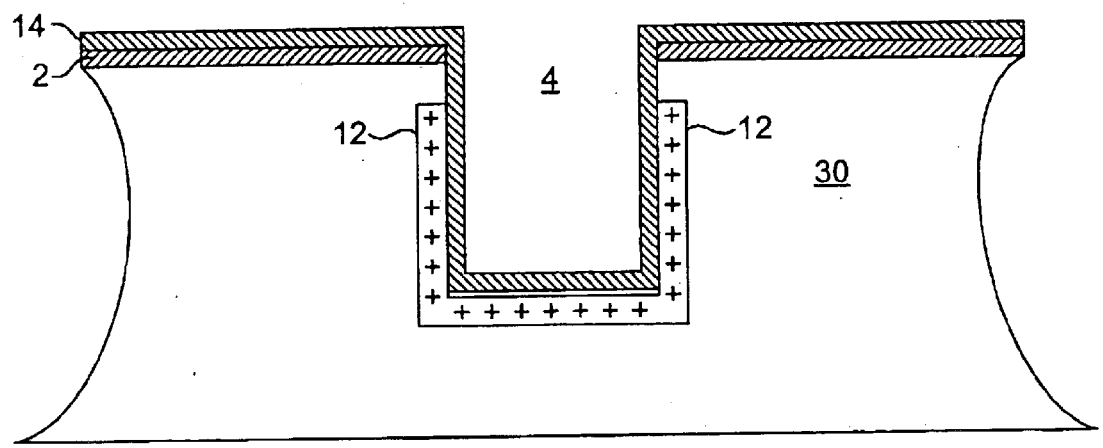
FIG. 7 is a cross sectional view of the isolation trench sidewalls used to form two DRAM capacitors after etching to remove oxide and doped layers followed by node dielectric deposition.

FIG. 7 is a cross sectional view through the isolation trench sidewalls used to form two DRAM capacitors after etching to remove oxide layer 10 and dopant layer 6 followed by node dielectric deposition. Wet etch with dilute HF, for example, simultaneously removes oxide layer 10 and doped glass region 6 while leaving semiconductor substrate 30, mask region 2 and substrate plate 12 unaffected.

A node dielectric layer 14 is conformally deposited using a suitable chemical vapor deposition (CVD) process. Preferably, tantalum pantaoxide (Ta$_2$O$_5$) is used to form layer 14. Alternatively, silicon oxide (SiO$_2$), silicon nitride (Si$_3$N$_x$), silicon oxide/silicon nitride/silicon oxide sandwich structure (ONO), BST, PZT or other suitable dielectric materials can be used to provide layer 14. The thickness of layer 14 depends upon, inter alia, the dielectric constant of the material in the layer, the surface area occupied by the capacitor plates, etc. Preferably, node dielectric layer 14 is between about 30 Å and about 200 Å thick. Most preferably, node dielectric layer 14 is between about 40 and about 100 angstroms thick.

A conventional requirement for a DRAM capacitor is a capacitance of about 25 femtofarads. Thus, the required trench depth of a isolation trench sidewall capacitor is directly related to the dielectric constant ($\epsilon$) of the node dielectric material. For example, when the design rule specifies a critical dimension (minimum critical feature) of about 0.25 μm, using tantalum pantaoxide as dielectric ($\epsilon$=22) requires a capacitor height of about 0.66 μm, if the required capacitance of the trench sidewall capacitor is 25 femtofarads.

Increasing the dielectric constant of the node dielectric reduces the required trench depth needed for a isolation trench sidewall capacitor. Thus, using materials such as BST and that have extremely large dielectric constants substantially can reduce the required trench depth of a isolation trench sidewall capacitor of a capacitance of about 25 femtofarads.

Figure 8:
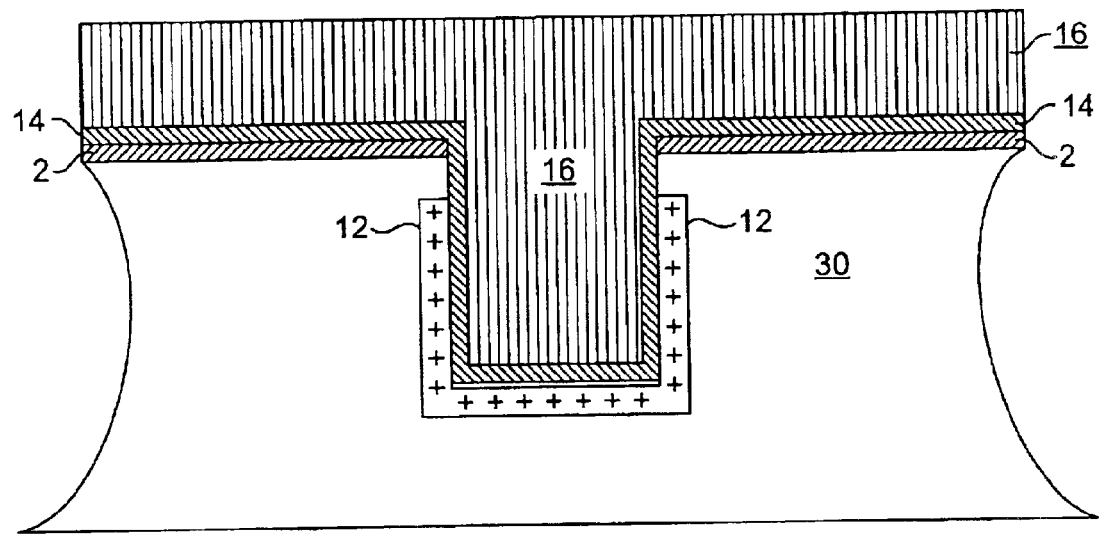
FIG. 8 is a cross sectional view of the isolation trench sidewalls used to form two DRAM capacitors after photoresist deposition.
Figure 9:
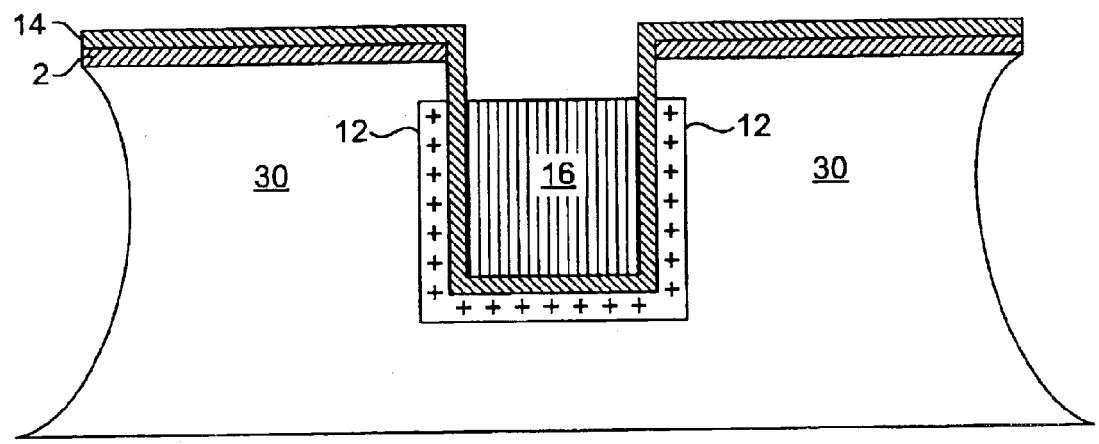
FIG. 9 is a cross sectional view of the isolation trench sidewalls used to form two DRAM capacitors after photoresist exposure and development to leave only a lower portion of the trench filled with photoresist.

FIG. 8 is a cross sectional view through the isolation trench sidewalls used to form two DRAM capacitors after photoresist deposition using existing technology. Photoresist 16 is deposited using conventional methods over node dielectric layer 14 and fills isolation trench 4. In FIG. 9, the photoresist has been exposed and developed. As previously mentioned careful control of the depth of focus and dose of blanket photoresist exposure determines the amount of resist removed during the process. After normal development photoresist 16 partially fills isolation trench 4.

Alternatively, conventional plasma etchback of deposited photoresist can provide recessed photoresist 16. Here, the amount of time the photoresist is exposed to the etch conditions controls the amount of photoresist removed.

Any photoresist outside of isolation trench 4 has been removed. The height of photoresist layer 16 in isolation trench 4 is below the level of the hard mask 2. The height of photoresist layer 16 inside isolation trench 4 should be higher than the vertical height as substrate capacitor plate 12 outside of isolation trench 4. Photoresist layer 16 protects immediately adjacent node dielectric 14 on the sidewalls of isolation trench 4 during the next process step, thus allowing for selective removal of any node dielectric 14 at the top of sidewalls of isolation trench 4 and over hard mask 2.

Figure 10:
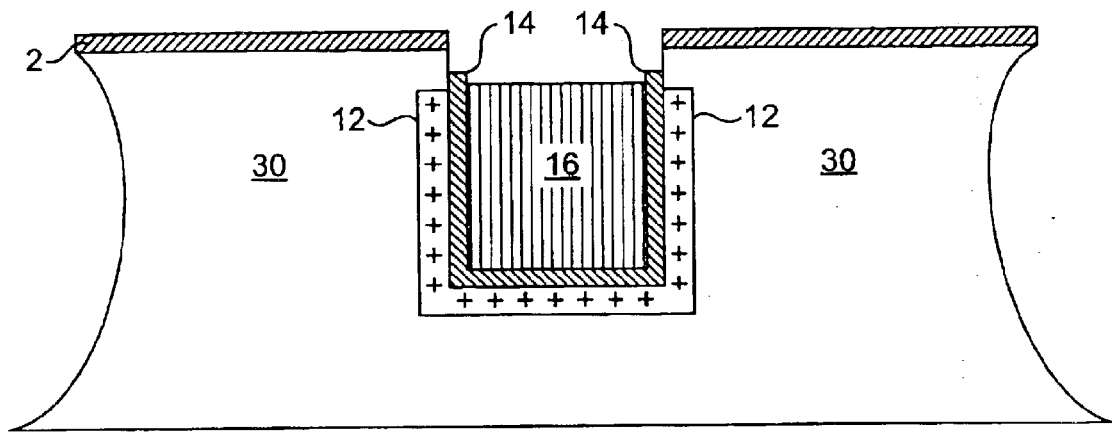
FIG. 10 is a cross sectional view of the isolation trench sidewalls used to form two DRAM capacitors after node dielectric etch to the level of the photoresist in the trench.

FIG. 10 is a cross sectional view through the isolation trench sidewalls used to form two DRAM capacitors after a node dielectric etch. Etching removes node dielectric 14 located at the top of the sidewalls of isolation trench 4 and over hard mask 2. However, node dielectric layer 14 immediately adjacent to photoresist 8 in isolation trench 4, hard mask 2 and silicon substrate 30 is unaffected by the etch conditions. Preferably, a wet etch is used, although a dry etch such as an argon etch may be used to remove a node dielectric material such as tantalum oxide.

Figure 11:
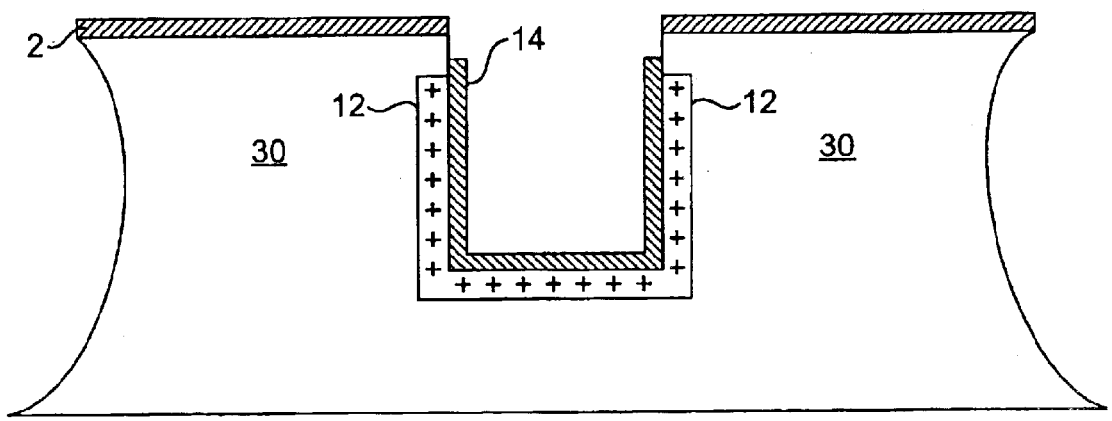
FIG. 11 is a cross sectional view of the isolation trench sidewalls used to form two DRAM capacitors after photoresist removal.

FIG. 11 is a cross sectional view through the isolation trench sidewalls used to form two DRAM capacitors after photoresist removal. Photoresist 16 is stripped using conventional conditions to leave node dielectric 14 adjacent to the sidewalls of isolation trench 4. The height of node dielectric 14 on the vertical sidewalls of isolation trench 4 is similar to the vertical height of photoresist layer 16 in FIG. 10 but should be higher than the vertical height of substrate plate 12. This ensures that the subsequently formed second capacitor plate does not short with substrate plate 12. Thus, controlling the vertical height of photoresist in isolation trench 4 through control of the depostion process and the blanket exposure ensures that the vertical height of node dielectric 14 in isolation trench 4 remains higher than the vertical height of the substrate plate 12 immediately adjacent to isolation trench 4.

Figure 12:
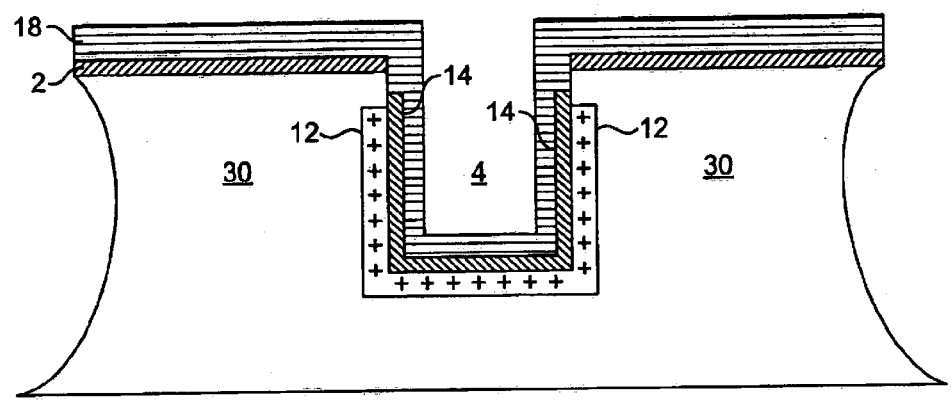
FIG. 12 is a cross sectional view of the trench isolation sidewalls used to form two DRAM capacitors after a layer of doped polysilicon has been conformally deposited.

FIG. 12 is a cross sectional view through the trench isolation sidewalls used to form two DRAM capacitors after conformal deposition of a doped polysilicon layer 18 using conventional methods. While polysilicon is a preferred material for the second plate, other conductive materials may be used in its place. Preferably, doped polysilicon layer 18 is deposited to a thickness of between about 200 Å and about 1000 Å. Doped polysilicon layer 18 should be evenly and continuously distributed over node dielectric 14 to function as a second capacitor plate in a trench isolation sidewall capacitor after modification in subsequent process steps. Importantly, doped polysilicon layer 18 does not completely fill isolation trench 4 thus allowing for selective anisotropic etch in a later process step.

Either n or p type dopants may be used in doped polysilicon layer 18 although, typically, the type of dopant used depends on the nature of semiconductor substrate 30. For example, when semiconductor substrate 30 is a uniformly lightly p doped single crystal silicon wafer, a n type dopant is used in doped polysilicon layer 18.

Figure 13A:
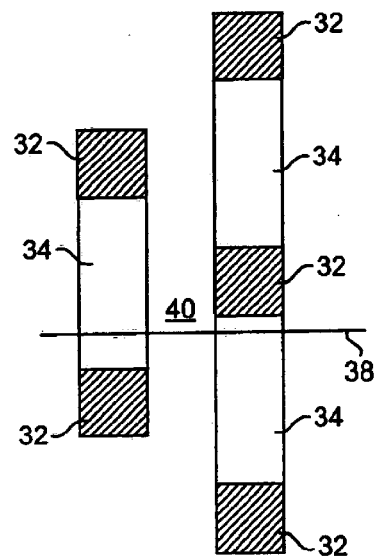
FIG. 13A is a top view that illustrating a mask layout after etching to remove regions of doped polysilicon and showing a horizontal cross section line (rotated 90 degrees with respect to the cell axis in FIG. 1B).

The direction through with the isolation trench cross section is viewed was irrelevant to the process steps described in FIGS. 2–12. However, in the ensuing process step the locations of the second capacitor plates are defined as shown in FIGS. 13A and 14A. Thus, the direction of the cross sectional view in subsequent steps determines whether a DRAM capacitor is or is not shown in the isolation trench. Thus, the isolation trench, as viewed in FIG. 13B, follows a cross section line illustrated in FIG. 13A and therefore does not show the capacitors. However, the isolation trench illustrated in FIGS. 14B, 15 and 16 follows a cross section line shown in FIG. 14A and therefore shows two DRAM capacitors formed on regions of the isolation trench sidewalls.

FIG. 13A is a top view of the partially fabricated DRAM device showing the locations of protected polysilicon that will provide the second capacitor plates. FIG. 13A also presents a cross sectional line 38 through which the substrate cross section shown in FIG. 13B is viewed.

Figure 13B:
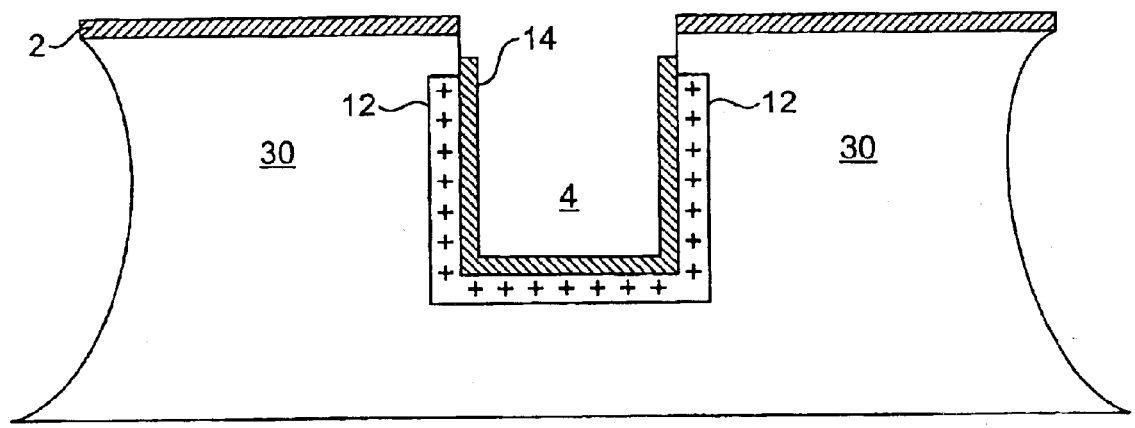
FIG. 13B is a cross sectional view through the horizontal cross section line of FIG. 13A showing isolation trench sidewalls after masking and etching to remove regions of doped polysilicon.
Figure 14A:
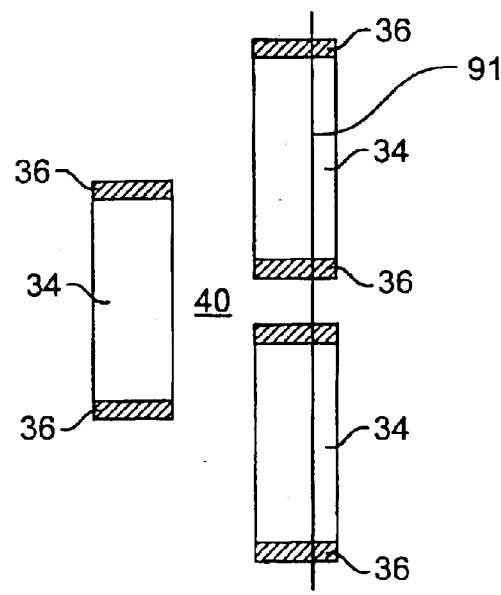
FIG. 14A a top view showing the structure after masking, isotropic etch of doped polysilicon, mask removal and trench poly spacer etch (to form poly capacitor plates) and showing a vertical cross section line.

The structure illustrated in FIGS. 13A and 13B is arises after masking and etching to remove regions of doped polysilicon. Prior to this process step, doped polysilicon covered the entire area illustrated in FIG. 13A. Note that the FIG. 13A DRAM array structure is shown at an angle of 90 degrees with respect to the structure shown in FIG. 1B (which may represent the same DRAM array arrangement). Doped polysilicon in active mesa region 34 is removed to allow subsequent formation of pass transistors. Doped polysilicon in region 40 is removed to prevent short circuiting between capacitor plates in adjacent cells.

Masking protects doped polysilicon regions 32 during the subsequent etching to remove doped polysilicon covering vertical trench regions 40. The hard mask is first patterned to define exposed regions 40. The mask may be rectangularly shaped take the form of linear strips, so long as regions 32 are protected and trench regions 40. In the particular example of FIG. 13A, the hard mask is rectangularly shaped and leaves mesa regions 34 exposed. In general, a patterned mask will include regions containing an etchant resistant material that protects doped polysilicon region 32 during the subsequent etch and exposed regions over locations 34 and 40. The patterning process may be performed by photolithography or other well known methods. Isotropic etch of doped polysilicon regions 34 and 40, using well known conditions, provides the structure depicted in FIG. 13A after mask removal. Doped polysilicon is found only in regions 32 and has been removed from regions 34 and 40.

FIG. 13B is a cross sectional view taken through the cross section line shown in FIG. 13A. FIG. 13B shows isolation trench sidewalls after masking and etching to remove regions of doped polysilicon. Importantly, an isotropic etch has removed all of doped polysilicon layer 18 from the illustrated region of trench 4. Since, doped polysilicon, which comprises a conductive layer necessary for capacitor formation, has been removed, trench 4, in the horizontal cross section line, cannot be converted to a trench isolation sidewall capacitor.

After the polysilicon has been etched, the mask protecting regions 32 is removed. Then the remaining polysilicon is subjected to an anisotropic or spacer etch. FIG. 14A is a top view showing the cross section line isolation trench sidewalls after masking, isotropic etch of doped polysilicon, mask removal and trench poly spacer etch. Note that FIG. 14A is oriented at an angle of 90 degrees with respect to FIG. 1B. The isotropic etch of doped polysilicon described previously removed doped polysilicon except the doped polysilicon regions 32 as shown in FIG. 13A. After mask removal, the doped polysilicon region 32 in FIG. 13A has been partially etched to yield isolation trench sidewall capacitors 36. Importantly, the nodes of isolation trench sidewall capacitors 36 are electrically isolated from other regions of doped polysilicon and can thus function as capacitor plates.

Figure 14B:
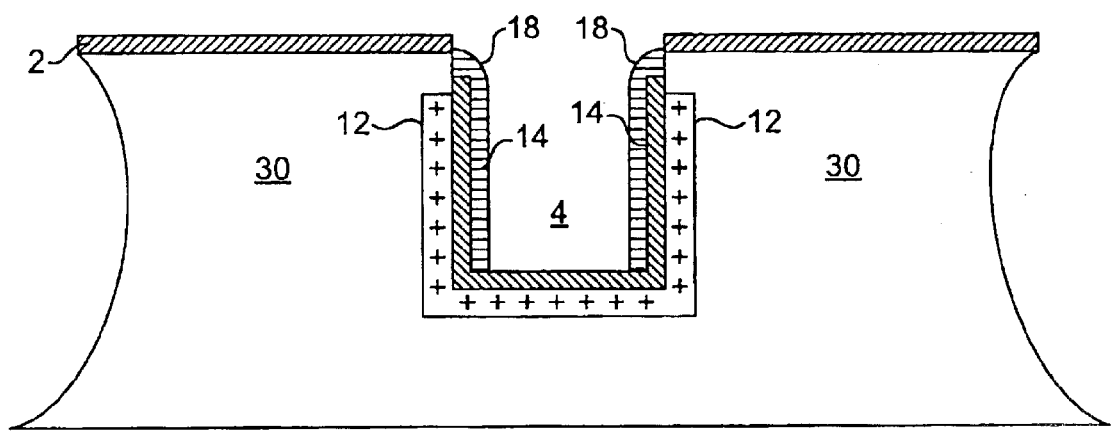
FIG. 14B is a cross sectional view through the vertical cross section line of FIG. 14A showing the isolation trench sidewalls after masking, isotropic etch of doped polysilicon, mask removal, and trench poly spacer etch.

FIG. 14B is a cross sectional view taken through the cross section of isolation trench sidewalls illustrated in FIG. 14A. The isotropic etch of doped polysilicon previously mentioned removed all doped polysilicon except the doped polysilicon covering the sidewalls of the FIG. 14A cross section line isolation trench 4. However, the doped polysilicon regions covering the vertical sidewalls cannot be used as capacitor plates because they conductively connect capacitors of two adjacent cells. The trench poly spacer etch selectively removes doped polysilicon from the bottom surface of isolation trench 4, thus electrically isolating doped polysilicon 18 on the vertical sidewalls of isolation trench 4 to complete isolation trench sidewall capacitors formation. Electrically isolated doped polysilicon layer 18 functions as a capacitor plates in isolation trench sidewall capacitors. Any suitable polysilicon spacer etch conditions may be employed. Typically, the etch will include a significant physical etching or sputtering component to ensure a highly anisotropic etch which selectively removes doped polysilicon from the bottom of isolation trench 4.

The etch is complete when capacitor plates 18 reach a desired height and thickness. They should extend above the top of node dielectric 14 where they contact a region of substrate 30 above the top of substrate plate 12. In a preferred embodiment, employing arsenic doped polysilicon in a 0.25 micrometer trench or 0.5 micrometers depth, capacitor plates 18 are between about 0.02 and 0.1 micrometers thick.

The trench isolation sidewall capacitor now consists of substrate plate 12, node dielectric 14 and polysilicon plate (node) 18. During normal DRAM operation, the substrate plates of the isolation trench sidewall capacitors are held at the potential of the substrate (e.g., ground). Thus, the electrical storage of a DRAM cell depends on the charge of the node in the isolation trench.

Figure 15:
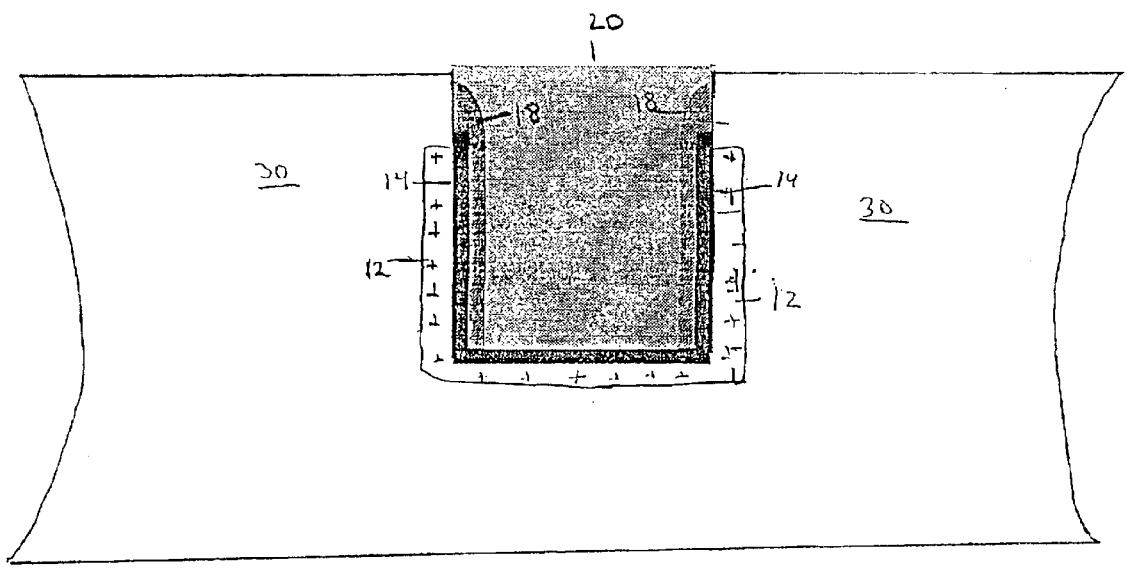
FIG. 15 is a cross sectional view of the isolation trench sidewalls after trench isolation oxide deposition, CMP and hard mask etch.
Figure 16:
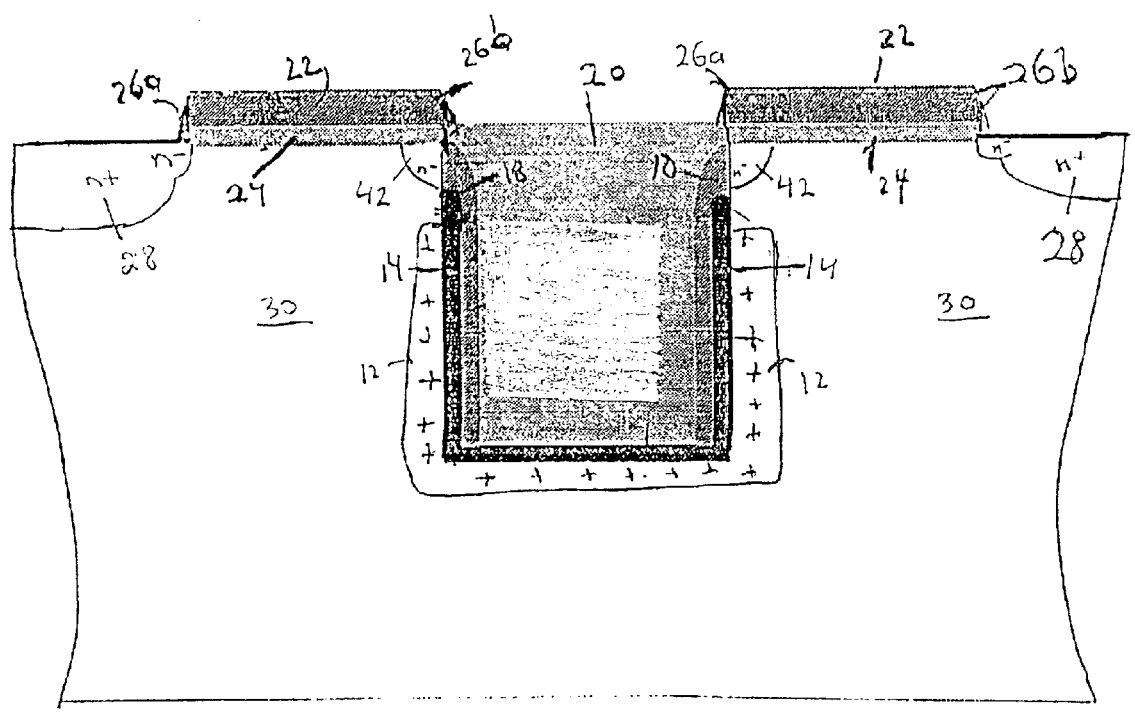
FIG. 16 is a cross sectional view of the isolation trench sidewalls after conventional transistor process flow.

FIG. 15 is a cross sectional view through the isolation trench sidewalls after trench isolation oxide fill and planarization. Preferably, blanket deposition of oxide or other suitable dielectric material 20 using well known methods fills isolation trench 4 to a level suitable to isolate adjacent devices. Typically, isolation dielectric 20 completely fills trench 4 and covers hard mask 2. In any event, a suitable planarization technique such as Chemical Mechanical Polishing (CMP) removes dielectric 20 that is above the level of hard mask 2. Subsequently, mask 2 is removed to yield bare semiconductor substrate 30. A conventional wet etch such as one employing hot phosphoric acid may be employed to remove hard mask 2.

FIG. 16 is a cross sectional view of the partially fabricated DRAM device after fabrication of pass transistors. It should be understood that any suitable process steps may be employed to fabricate the pass transistors, which are typically conventional MOS transistors. A gate oxide layer 24 is formed over silicon substrate 30 using well known methods such as a controlled thermal oxidation. Thereafter a gate electrode material such as polysilicon is deposited over gate oxide layer 24 and then patterned using methods well known to one well skilled in the art to provide gate electrodes 22.

Next, source regions 28 are formed. In some cases, source regions 28 are formed in a single implant step. In many conventional fabrication schemes the source 28 will be formed in two steps. In such processes, a Lightly Doped Drain Implant (LDD) is initially performed to provide a doped source region extending under gate oxide layer 24. Source regions 28 are completed after forming spacers 26a and 26b adjacent to the gate electrodes 22. The spacers may be formed by depositing a blanket layer of oxide or nitride on the wafer surface followed by anisotropic etch. Then a second ion implant forms source regions 28 that extend beyond the spacers. The polysilicon gate electrodes 22 may be exposed to one or both of the implants depending on how much dopant is needed in the gate.

At some point in the process, drain regions 42 are formed. In a preferred embodiment, they are formed subsequent to formation of capacitor plates 18 during a thermal process step which causes dopant from plate 18 to diffuse into drain regions 42 to form local lightly n doped regions. Such thermal step may be a separate step performed exclusively for the purpose of forming drain regions 42 or it may be another step required for some other process such as formation of gate oxide 24 or a subsequent silicide formation step. In any event, it is necessary at some point to form drain regions 42 in order to complete the pass transistors which are electrically coupled to the isolation trench side wall capacitors. Note that because drain regions 42 are of the opposite conductivity type as substrate plates 12, the pass transistors are electrically isolated from plates 12.

After the source/drain regions have been formed, a silicide (not shown) may formed on top of the gate electrodes and source regions to create less resistive contacts. Then, a passivation layer of, e.g., borophosphosilicate glass ("BPSG") is deposited over the entire structure to define an interlayer dielectric (ILD).

Suitable back end process steps will now be described. Initially, a contact mask is formed on the passivation layer to define contact regions to device elements on the substrate and to the associated polysilicon gate electrodes. Thereafter, the passivation region is etched (typically by a plasma etch) to form vertical contact holes through the passivation layer to level 1 (the underlying substrate and polysilicon). At this point, a diffusion barrier layer (sometimes referred to as a "glue" layer) made of a material such as a titanium nitride layer is formed to protect the device elements adjacent the contact holes from ingress of metal atoms from a subsequently deposited metallization layer. In some processes, the contact holes are filled with tungsten plugs according to procedures known in the art. A planarization step maybe needed after the via holes are filled. Regardless of whether tungsten plugs are formed, a blanket deposition of a first metallization layer is performed. The first (and all subsequent) metallization layers may be made from various metals used in the industry such as aluminum (Al), aluminum copper (AlCu), or aluminum silicon copper (AlSiCu). These layers are conventionally deposited by sputtering, as is well known in the industry.

After the first metallization layer has been deposited, it is patterned to form lines connecting various DRAM cells. The exact layout of the lines will be determined by the particular DRAM design. The patterning is done by first depositing a mask such as a photoresist and then exposing it to light to define the pattern of metal lines to be created in a subsequent etch step. Thereafter, the underlying first metallization layer is etched by a plasma process such as reactive ion etching (RIE).

After the first metallization layer has been etched, the photoresist is removed and a dielectric layer is deposited over the first metallization layer in order to insulate this metallization layer from the next successive metallization layer (i.e., the second metallization layer). Typically, oxide or borophosphosilicate glass is used as the dielectric layer, but other dielectrics such as a nitride, spin on glass (SOG), or polyimide films (which can also be laid on by spinning) may also be used. The dielectric layer is then planarized by any appropriate technique. After a dielectric layer has been formed and planarized as described, a via mask is formed on the dielectric layer's upper surface. The via mask will define vias or regions where interconnects between the first and second metallization layers are to be formed. Thereafter, another plasma assisted etch is performed to create the actual vias in the dielectric layer. These are then filled with tungsten (which is planarized), before the next metallization layer (metal-2) is deposited and patterned as described above. In some cases, it may be necessary to form and pattern one or more additional metallization layers to complete the wiring of the DRAM.

Generally, the DRAMs of this invention can be used in any application where conventional DRAMs find use, They may be used in DRAM chips or as embedded memory in logic chips. Specific examples of embedded memory chips which can make use of the DRAM designs of this invention include printer and graphics integrated circuits.

Although the foregoing invention has been described in some detail to facilitate understanding, it will be apparent that certain changes and modifications may be practiced within the scope of the appended claims. For example, while the specification has been limited to a discussion of doped polysilicon to form a node there is in principle no reason why other conductive materials could not be used to form a node. And although isolation trench side wall capacitors have been illustrated as being particularly useful in DRAM cells that follow a design rule of 0.25 micrometers and have isolation trenches of a depth of at least about 0.5 micrometers the instant invention is not limited to DRAM cells or trenches of these dimensions. Accordingly, the present embodiments are to be considered as illustrative and not restrictive, and the invention is not to be limited to the details given herein, but may be modified within the scope and equivalents of the appended claims.

What is claimed is:

1. A DRAM structure formed on a semiconductor substrate comprising:
   a first isolation trench that provides a first capacitor for a first DRAM cell adjacent to said first isolation trench; wherein
       said first isolation trench is at least partially filled with a dielectric that electrically isolates said first DRAM cell from one or more adjacent DRAM cells;
       said first capacitor comprises a first capacitor plate and a second capacitor plate separated by a dielectric layer; wherein
           said first capacitor plate is formed in said semiconductor substrate adjacent to said first isolation trench, and wherein said first capacitor plate has a first dopant concentration and the semiconductor substrate adjacent to said first capacitor plate has a second dopant concentration wherein said first dopant concentration is substantially greater than said second dopant concentration;
   a second isolation trench that provides a second capacitor for a second DRAM cell adjacent to said second isolation trench; wherein
       said second isolation trench is at least partially filled with a dielectric that electrically isolates said second DRAM cell from one or more adjacent DRAM cells;

said second capacitor comprises a third capacitor plate and a fourth capacitor plate separated by a dielectric layer, wherein
said third capacitor plate is formed in said semiconductor substrate adjacent to said second isolation trench;
a common source region located between said first DRAM cell and said second DRAM cell that is shared by said first DRAM cell and said second DRAM cell;
a third isolation trench substantially perpendicular to said first isolation trench and said second isolation trench; and
a fourth isolation trench substantially parallel to said third isolation trench;
whereby said first DRAM cell, said second DRAM cell and said common source region are surrounded by said isolation trenches, and
wherein said first, second, third, and fourth capacitor plates are substantially planar.

2. The DRAM structure of claim 1 wherein said conductive layer of said second capacitor plate is between about 200 Å and about 1000 Å thick.

3. The DRAM structure of claim 1 wherein said isolation trench has a depth of at least about 0.3 μm.

4. The DRAM structure of claim 1 wherein said isolation trench has a width of at most about 0.5 μm.

5. The DRAM structure of claim 1 wherein said dielectric layer includes at least one of $SiO_2$, $Si_3N_x$, silicon oxynitride, sandwich layers of $SiO_2/Si_3N_x/SiO_2$, $Ta_2O_5$, BST and PZT.

6. The DRAM structure of claim 1 wherein said dielectric layer has a dielectric constant of at least about 10.

7. The DRAM structure of claim 1 wherein said dielectric layer includes $Ta_2O_5$.

8. The DRAM structure of claim 1 wherein said dielectric layer is between about 50 Å and about 200 Å thick.

9. The DRAM structure of claim 1 wherein
said second capacitor plate is defined by a conductive layer within and adjacent to said first isolation trench; and
said fourth capacitor plate is defined by said conductive layer within and adjacent to said second isolation trench.

10. The DRAM structure of claim 1 wherein said conductive layer is polysilicon.

11. The DRAM structure of claim 1 wherein said second isolation trench has a depth of at least about 0.3 μm.

12. The DRAM structure of claim 1 wherein said second isolation trench has a width of at most about 0.5 μm.

13. The DRAM structure of claim 1 wherein said third isolation trench has a depth of at least about 0.3 μm.

14. The DRAM structure of claim 1 wherein said third isolation trench has a width of at most about 0.5 μm.

15. The DRAM structure of claim 1 wherein said fourth isolation trench has a depth of at least about 0.3 μm.

16. The DRAM structure of claim 1 wherein said fourth isolation trench has a width of at most about 0.5 μm.

* * * * *